United States Patent [19]

Muraoka et al.

[11] Patent Number: 5,640,355
[45] Date of Patent: Jun. 17, 1997

[54] SEMICONDUCTOR MEMORY DEVICE

[75] Inventors: Kazuyoshi Muraoka; Masaru Koyanagi; Yoshiaki Takeuchi, all of Yokohama, Japan

[73] Assignee: Kabushiki Kaisha Toshiba, Kawasaki, Japan

[21] Appl. No.: 471,507

[22] Filed: Jun. 6, 1995

Related U.S. Application Data

[63] Continuation of Ser. No. 121,518, Sep. 16, 1993, abandoned.

[30] Foreign Application Priority Data

Sep. 16, 1992 [JP] Japan ................................. 4-246820

[51] Int. Cl.$^6$ ................................................. G11C 7/00
[52] U.S. Cl. ..................... 365/207; 365/202; 365/203; 365/205
[58] Field of Search ................................. 365/207, 205, 365/203, 230.03, 202

[56] References Cited

U.S. PATENT DOCUMENTS

| | | | |
|---|---|---|---|
| 5,301,158 | 4/1994 | Yokomizo | 365/207 X |
| 5,307,317 | 4/1994 | Shiraishi et al. | 365/207 X |
| 5,307,321 | 4/1994 | Sasai et al. | 365/205 X |
| 5,315,555 | 5/1994 | Choi | 365/207 |

Primary Examiner—Do Hyun Yoo
Attorney, Agent, or Firm—Foley & Lardner

[57] ABSTRACT

A semiconductor memory device including a memory cell array, bit lines, and sense amplifier groups. The memory cell array is composed of a plurality of memory cells arranged roughly in a matrix pattern. A plurality of the memory cells arranged in a row are activated in response to a row address decode signal. A pair of the bit lines are provided for each column. The data of the corresponding activated memory cells are transmitted to the bit line pair. Each of the sense amplifier groups has n-units of sense amplifiers each connected to the bit line pair, to sense and amplify data read to the bit line pair connected thereto. The respective reference potential terminals of the sense amplifiers of each of the sense amplifier groups are connected to a single common node which can be connected to a reference potential via a sense amplifier activating transistor turned on in response to a row address signal. The sense amplifiers can be operated at high speed, while preventing erroneous operation, because the wiring resistances and the parasitic capacitances of the common source node of the sense amplifiers can be reduced.

22 Claims, 13 Drawing Sheets

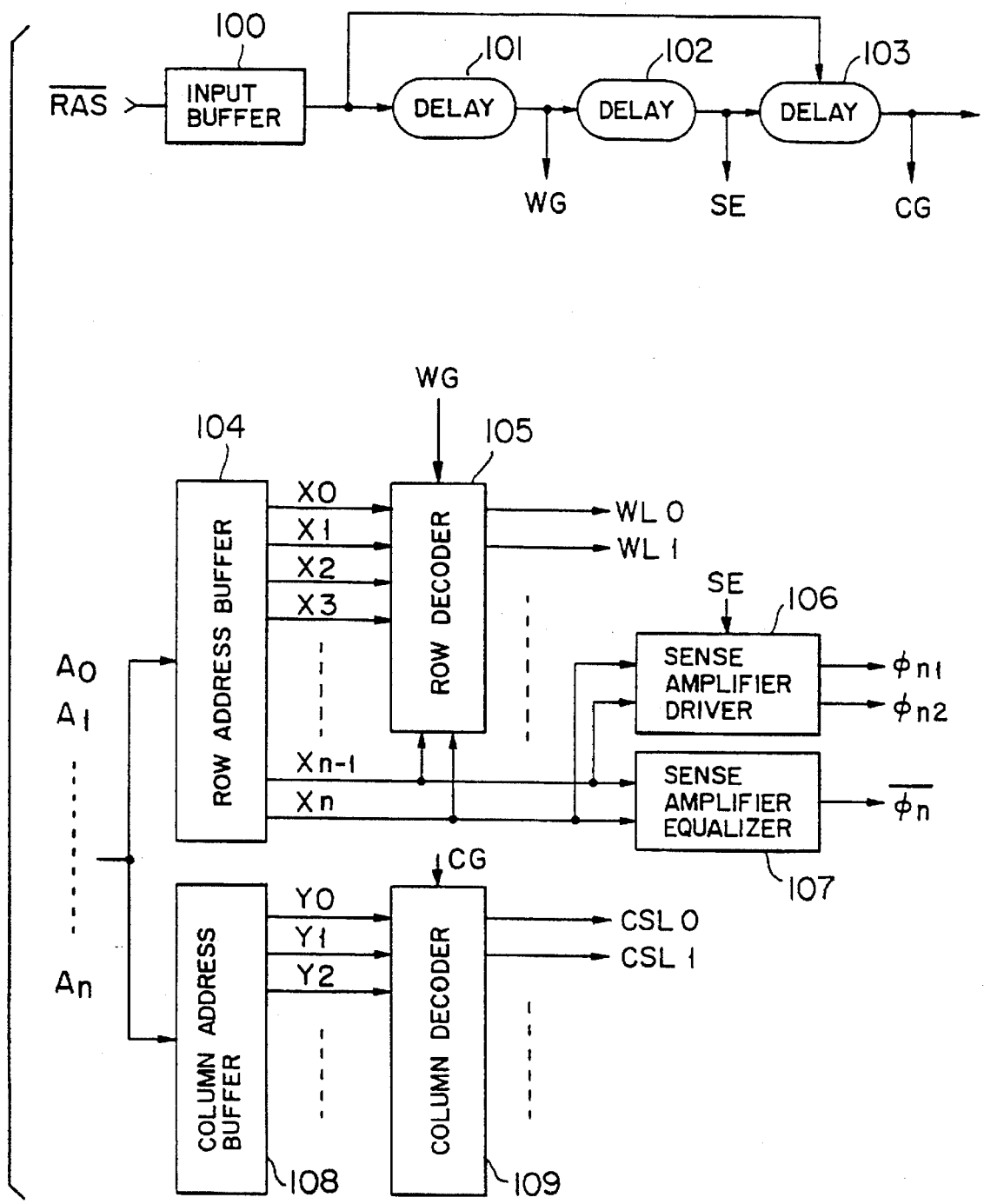
F I G. 10

SEMICONDUCTOR MEMORY DEVICE

This application is a continuation, of application Ser. No. 08/121,518, filed Sep. 16, 1993 now abandoned.

FIELD OF THE INVENTION

The present invention relates to a semiconductor memory device, and more specifically to a semiconductor memory device which can shorten the access time thereof.

BACKGROUND OF THE INVENTION

In a dynamic RAM (referred to as DRAM, hereinafter), a plurality of sense amplifiers each as shown in FIG. 6 are incorporated to amplify the information signals stored in the memory cells to a logical level, respectively. In FIG. 6, a memory cell is composed of a capacitor and a gate transistor. One end of this gate transistor is connected to a bit line BL or/BL, and the other end thereof is connected to the capacitor. The gate of this transistor is connected to a word line WL. Further, a predetermined voltage $V_{REF}$ is applied to the other end of this capacitor. When data is written in the memory cell, the word line WL is set to a high potential to turn on the gate transistor, and further the bit line BL is set to a high level potential VDD or a reference potential VSS. The nodes of the memory cell are set to these potentials. Thereafter, the word line WL is set to the reference potential VSS to turn off the transistor, in order that the information can be stored in the memory capacitor as a charge. On the other hand, when the stored information is read out of the memory cell, a control line EQL for precharge is set to a high potential to turn on transistors T5 to T7. When the transistor T5 is turned on, bit lines BL and/BL are connected to each other and therefore equalized at the same potential. A line VBL is connected to one end of each of the two transistors T6 and T7, and a voltage of (½) VCC is applied to this line VBL. The bit lines BL and/BL are connected to the other end of each of the two transistors T6 and T7, respectively. Accordingly, the bit line on the L-level side is raised in potential and the bit line on the H-level side is lowered in potential, so that both the potentials of the bit lines BL and/BL are set to the same potential of (½) VCC. Thereafter, the line EQL is set to a low level to turn off the transistors T5 to T7. Further, the word line is activated, so that the bit lines potentials change according to the status of the memory cell. These small signals of the bit lines are amplified differentially by lowering the potential at the node/SAN of the common sources of two cross-coupled nMOS transistors T1 and T2. The potential at the node/SAN is set to VSS and the potential at the common node SAP of two cross-coupled pMOS transistors T3 and T4 is pulled up to VDD. Therefore, the potential of a pair of the bit lines swings full between the potentials VDD and VSS, so that the node potential of the memory cell is set to VDD or VSS for refreshment. When a column select signal CSL is supplied, two DQ gates are turned on, so that the logical levels according to the stored information can be derived to the lines DQ and/DQ.

In the DRAM or some of SRAM, the differential type sense amplifier SA as shown in FIG. 5 is provided for each pair of the bit lines. The potential at the common sources of a pair of the nMOS transistors of each sense amplifier SA is derived as the potential VSS from the node /SAN through a transistor QSAN. In the above-mentioned DRAM, however, the number of memory cells connected to the single word line increases with increasing capacity of the transistor DRAM, and thereby the number of bit lines also increases accordingly, thus causing the following problem:

The data read case is taken into account, where a greater part of the cells selected when the word lines WL rise are at a high level and only a small part of the cells are at a low level (referred to as the column bar pattern). When a high or low level cell data is read to one of a pair of the bit lines, the sense amplifier of the DRAM operates in such a way as to decide the high level and the low level, by previously setting the other of the bit lines to an intermediate level between the high level of the cell and the bit line level (from which the low level is read) and further by differentially amplifying the set intermediate level and the level of the line from which the cell data is read.

FIG. 7 shows the potentials of the sense amplifier in the column bar pattern, in which BL and/BL denote a pair of bit lines for a low level read column, BL' and /BL' denote a pair of bit lines for a high level read column, and $V_{TH}$ denote the potential difference between the gate and source of the transistor. The initial potentials of the low level read column bit lines BL and /BL are $V_L$ and $V_R$, respectively, and the initial potentials of the high level read column bit lines BL' and /BL' are $V_H$ and $V_R$, respectively. When the transistor QSAN shown in FIG. 5 operates and thereby the potential at the node/SAN is being pulled to the ground potential VSS, at time T1, the differential amplifications of a greater part of the high level read columns begin; and thereafter at time T2, the differential amplifications of a small part of the low level read columns begin. The reason why there exists a difference in timing of the amplification start time between the two is that there exists a difference in timing between when the potential drops from the high level potential $V_H$ of the bit line pair of the high level read columns to the transistor operating potential $V_{TH}$ and when the potential drops from the high level potential $V_R$ of the bit line pair of the low level read columns to the transistor operating potential $V_{TH}$. Therefore, when the transistor QSAN for activating the sense amplifiers is turned on, charge current flows from all the bit lines of the sense amplifiers activated simultaneously to the coon source node/SAN of the N-channel sense amplifiers.

In this case, at the node /SAN, since the total capacitance of a great number of high level read bit lines increases to such a degree equivalent to a battery cell momentarily, the wiring resistance between the node /SAN and the ground potential VSS or the turn-on resistance of the transistor QSAN cannot be disregarded, with the result that the node/SAN is momentarily clamped at an intermediate level.

Under these conditions, the sense amplifiers of the low level read bit lines to be operated successively are not turned on immediately, so that after the start of the sensing operation, it takes a long time before the potential difference between the gate and the source reaches a sufficient value. As a result, it is necessary to provide a sufficient margin of the bit line sensing operation, thus causing the delay of the access time of the memory device.

To overcome the above-mentioned problem, a circuit for selectively increasing the performance of the sense amplifier by use of a column select line CSL decoded by an column address has been proposed, as shown in FIGS. 12 and 13 (SYMPOSIUM ON VLSI CIRCUIT, 1989 (DIGEST OF TECHNICAL PAPERS P103 TO 104)).

In the circuit as shown in FIG. 13, N-channel transistors Qn11, Qn12, ... (the gates of which a supply voltage VCC is applied, respectively) are connected as resistance components between the common source nodes S1, S2, ... of the sense amplifier circuits SA1, SA2, ... and a wiring/SANn, respectively. Further, the common source nodes S1, S2, ...

are connected to a reference potential VSS via N-channel transistors Qn21, Qn22, . . . (which operate as switching elements), respectively. Signals CSL1, CSL2, . . . decoded on the basis of the column addresses are applied to the gates of the transistors Qn21, Qn22, . . . to turn on only the transistor of the selected column.

When the transistor QSAN for activating the sense amplifiers are turned on to start the sensing operation, the current of the transistor on the side where the bit line potential is pulled down to a low level is discharged to the reference potential (VSS) terminal via the respective bit line, the transistor Qn11, Qn12, . . . corresponding to the sense amplifier, the wiring/SAN, and the sense amplifier activating transistor QSAN. Therefore, only the transistor Qn21, Qn22, . . connected to the sense amplifier of the selected column is turned on, so that the common source node of the sense amplifier is bypassed to the reference potential (VSS) terminal. In this case, only the parasitic capacitances existing in the selected bit line exert influence upon the above-mentioned current flow and further the potential at the common source node is pulled quickly to the reference potential VSS, so that it is possible to improve the amplification performance selectively.

On the other hand, the circuit configuration and the pattern layout of the semiconductor circuit are now being improved more and more with the advance of the recent multi-wiring technique. FIG. 15 shows an example of the circuit configuration in which the column select lines CSL (the outputs of a column decoder) are arranged in parallel to the bit lines so as to be used in common for a plurality of unit core blocks. In this circuit configuration, since only one column decoder is used for a plurality of unit core blocks, it is possible to reduce the chip area. The unit core block is roughly composed of a cell array section, a sense amplifier section and a DQ gate section for transferring the potential of the selected bit line potential to the DQ line.

Further, in order to reduce the operating current, such a method has been widely used that the memory cells are divided into a plurality of the above-mentioned unit core blocks for reduction of the number of the unit core blocks activated simultaneously (referred to as core block separating operation, hereinafter). In this method, the transistors QSAN for activating the sense amplifiers as shown in FIG. 13 are activated selectively in response to signals Φn decoded on the basis of an row address. When the circuit configuration as shown in FIG. 14 is operated in accordance with the core block separating operation, since the column select line CSL is used in common for a plurality of the unit core blocks, the column select signal CSL is inputted not only to the selected unit core blocks but also to the non-selected unit core blocks.

The problem caused when the column select signal CSL is inputted to the non-selected unit core blocks will be described hereinbelow with reference to FIG. 14. In the non-selected unit core blocks of the semiconductor memory device of bit line (½) VCC precharge type, the potentials of the node/SANn, the bit line pair, and the common sources are all set to (½) VCC. Therefore, when the selected column select signal CSL rises under these conditions, the transistor Qn21 connected between the common source S1 and the reference potential VSS is turned on in response to the column select signal CSL applied to the gate thereof, to pull down the potential of the common source S1 to the reference potential VSS. In this case, the charge current i2 of the node/SANn and the charge current i3 of the bit line pair BL2 and/BL2 (corresponding to the column to which the non-selected column select signal CSL is inputted) flow, in addition to the charge current i1 of the bit line pair BL1 and /BL2 (corresponding to the column to which the selected column select signal CSL is inputted). In other words, the current i (i=i1+i2+i3) flows through the transistor Qn21, as shown in FIG. 14. Accordingly, first the operating current increases markedly. Secondly, there exists a possibility that the potential of the bit lines BL and/BL to be precharged to the (½) VCC is set to a potential lower than the predetermined set potential of (½) VCC by the charge currents of i1, i2 and i3. Therefore, the margin of reading "0" from the memory cell is reduced, thus deteriorating the bit line sensing operation.

SUMMARY OF THE INVENTION

Accordingly, the object of the present invention is to provide a semiconductor memory device operable at high speed, without causing any erroneous sensing operation.

To achieve the above-mentioned object, the first aspect of the present invention provides a semiconductor memory device comprising: a memory cell array composed of a plurality of memory cells arranged roughly in a matrix pattern, a plurality of the memory cells arranged in a row being activated in response to a row address decode signal; bit lines provided for each column, data of the corresponding activated memory cells being transmitted to said bit lines; and sense amplifier groups each having n-units of sense amplifiers each connected to said bit lines, each sense amplifier sensing and amplifying data read to said bit lines connected thereto; and respective reference potential terminals of the sense amplifiers of each of said sense amplifier groups being connected to a single common node connectable to a reference potential.

The common node is connected to the reference potential via switching means. The switching means is turned on in response to a row address signal. The charging means for charging the common node is further provided for each of said sense amplifier groups. The charging means is a charging switch connected between the common node and a supply voltage. The sense amplifiers of each of said sense amplifier groups can output data independently or simultaneously.

Further, the second aspect of the present invention provides a semiconductor memory device comprising: a plurality of memory blocks each having a plurality of memory cells arranged roughly in a matrix pattern, a plurality of any given memory blocks being selected on the basis of a row address; and in the selected memory block, the memory cells arranged in a row corresponding to the row address being activated; bit lines provided for each column of each of said memory blocks, data of the corresponding activated memory cells being transmitted to said bit lines; and sense amplifiers each connected to said bit lines, for sensing and amplifying data read to said respective bit lines connected thereto, respective reference potential terminals of any given numbers of said sense amplifiers of each of said memory blocks being connected to a first wiring and further to a second wiring via a column select switch, respectively; the first wiring being connected to a reference potential via a first sense amplifier activating switch; the second wiring being connected to the reference potential via a second sense amplifier activating switch; the column select switch being controllably turned on or off in response to a column address signal; and the first and second sense amplifier activating switches being controllably turned on or off in response o the row address signal in such a way that only the first and second activating switches of the selected memory block can be turned on.

In the first aspect of the present invention, the source node of each of the sense amplifiers connected to the same word lines is separated for each sense amplifier, and means for charging each source node to a predetermined potential and a transistor for activating each source node are provided individually for each sense amplifier (in the case of n=1). Further, a plurality of source nodes of a plurality of the sense amplifiers connected to the same word lines are connected in common for each group, and means for charging the source nodes to a predetermined potential and a transistor for activating the source nodes are provided together for each group of the sense amplifiers (in the case of n=2 or more). Therefore, since the wiring resistances and the parasitic capacitances of the common source node (or nodes) of the sense amplifier (or amplifiers) can be reduced, it is possible to prevent the common source potential from being clamped, while increasing the speed of the sensing operation.

In the second aspect of the present invention, when data is read, the first and second sense amplifier activating transistors of only the unit core block selected by a row address are turned on, and further only the switching element connected to the column select line selected by a column address is turned on. Therefore, only the sense amplifiers corresponding to the row address and the column address are connected to the reference potential through the first and second common wirings for activation. In this case, since only the switching element connected to the column select line is turned on among a plurality of switching elements connected to the second common wiring, it is possible to connect the selected sense amplifier to the reference potential through the second common wiring small in the wiring resistance and the parasitic capacitance. Therefore, since only the sense amplifier of the selected column of the selected unit core block can be selectively activated, it is possible to improve the speed of the operation of sensing the bit line potential.

BRIEF DESCRIPTION OF THE DRAWING

FIG. 10 is a block diagram showing a control signal generating circuit of the fourth embodiment;

DETAILED DESCRIPTION OF THE PREFERRED EMBODIMENTS

Figure 1:
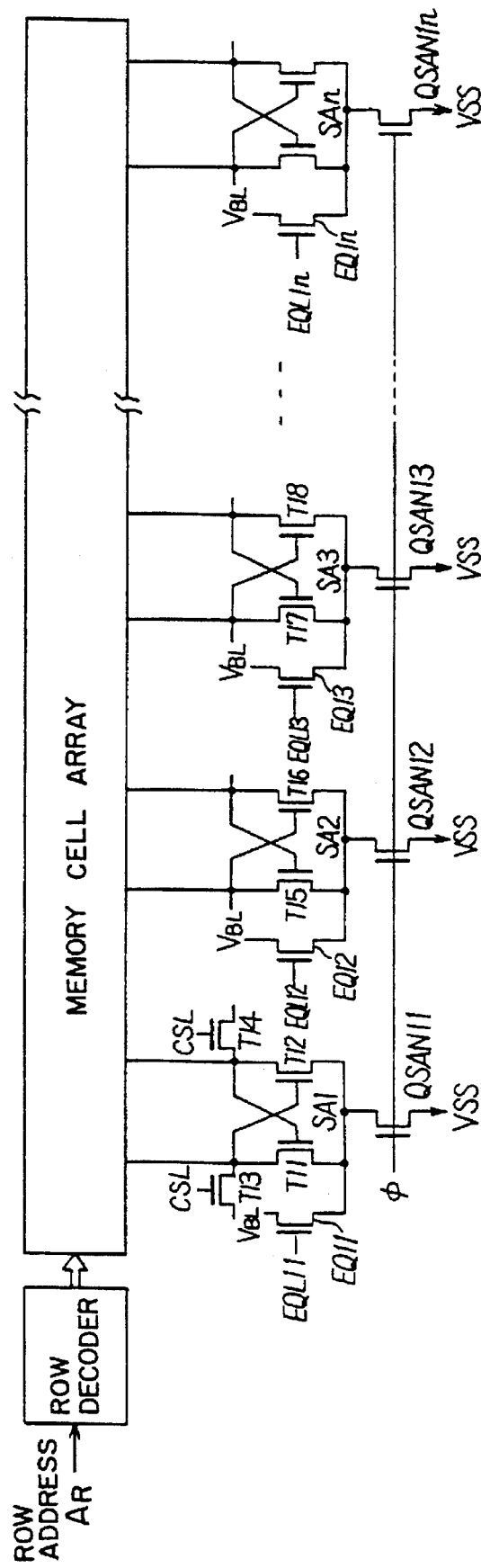
FIG. 1 is a circuit diagram showing a first embodiment of the present invention.
Figure 5:
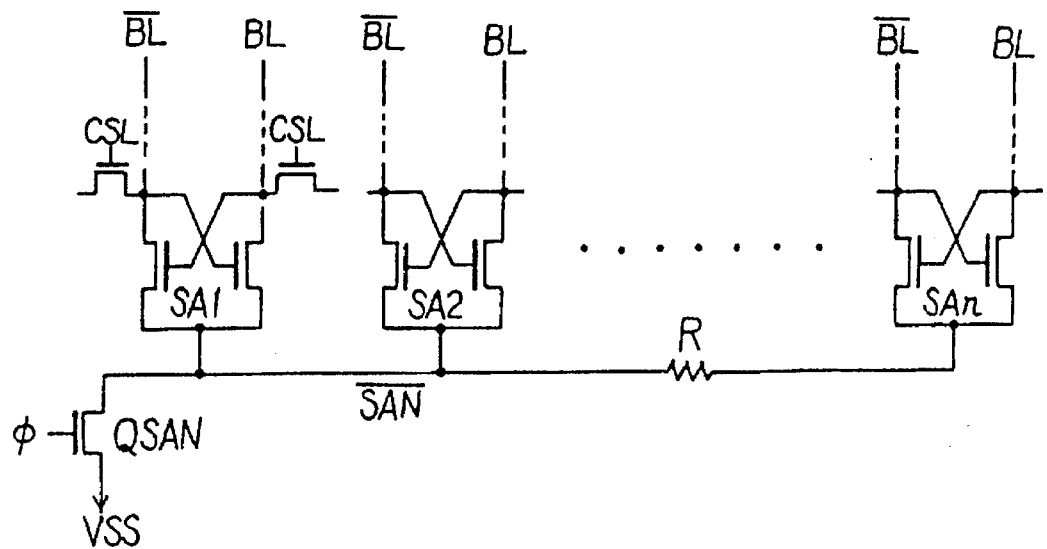
FIG. 5 is a circuit diagram showing an example of the conventional semiconductor memory circuit.
Figure 6:
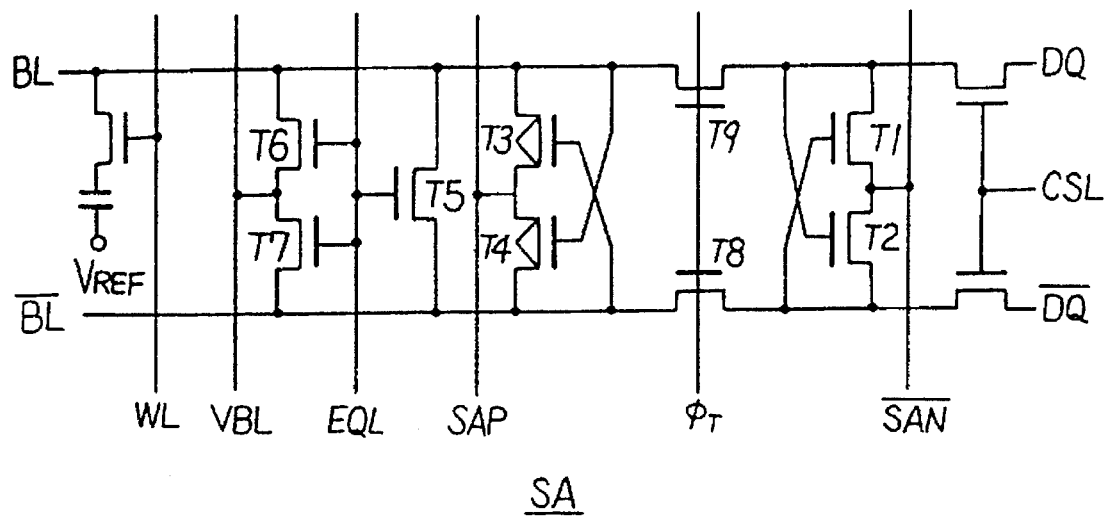
FIG. 6 is a circuit diagram showing an example of the sense amplifier of a DRAM.
Figure 7:
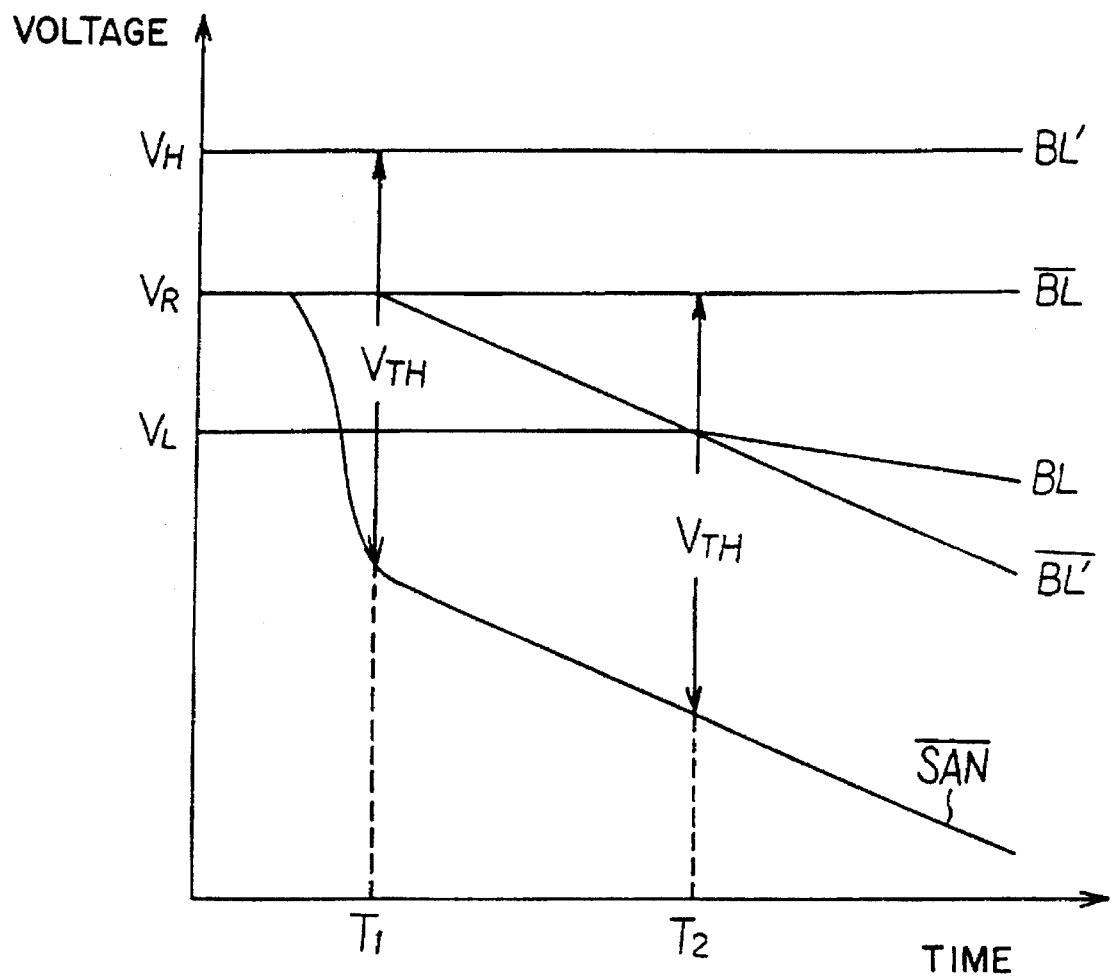
FIG. 7 is a signal waveform diagram for assistance in explaining the operation of the sense amplifier of column bar pattern type.

FIG. 1 shows a first embodiment of the semiconductor memory device according to the present invention, in which the sense amplifiers of differential amplifier circuits are connected to a memory cell array. In the drawing, each source node /SAn of each of the sense amplifiers connected to the same word line WL (not shown) is provided individually for each sense amplifier. Further, a transistor EQln controlled in response to a source node charging signal EQLln (n=1, 2, . . .) and a sense amplifier activating transistor QSANln (n=1, 2, . .) are provided for each of the sense amplifiers, independently. Further, since means for charging the common source node of the sense amplifier is provided individually, it is possible to set the potential at the common source node (floated after the sensing operation) to (½) Vcc during the precharge. In this embodiment, since the wiring resistances and the parasitic capacitances of the common source node of each of the sense amplifiers can be reduced, it is possible to prevent the common source potential from being clamped, while increasing the speed of the sensing operation, when compared with the conventional sense amplifiers as shown in FIG. 5.

Figure 2:
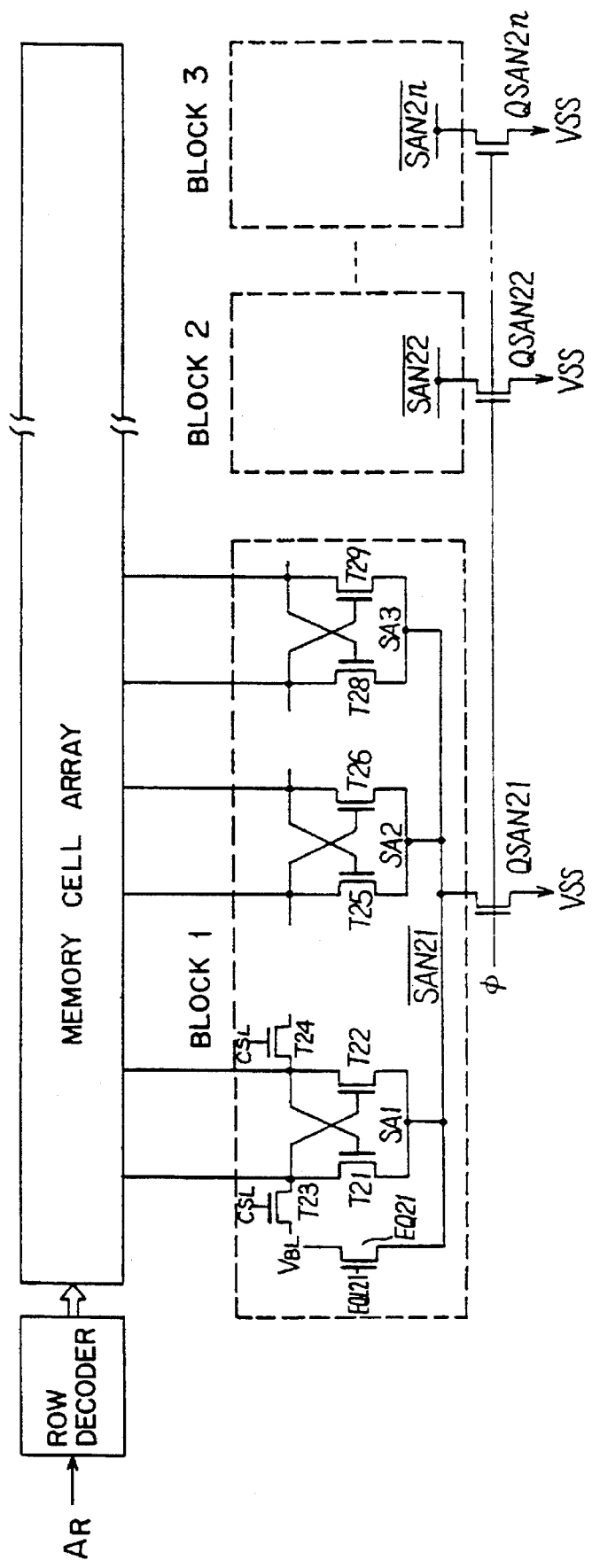
FIG. 2 is a circuit diagram showing a second embodiment of the present invention.

FIG. 2 shows a second embodiment of the semiconductor memory device according to the present invention, in which the sense amplifiers of differential amplifier type are shown. In FIG. 2, a plurality of sense amplifiers connected to the same word line are collected as a single block. The source nodes/SAN21 of the sense amplifiers within the same single block are connected in common. Further, a transistor EQ21 controlled in response to a source node (/SAN21) charging signal EQL21 and a sense amplifier activating transistor QSAN21 are both provided together for the sense amplifiers of the same block, respectively. A plurality of unit blocks as described above are repeatedly arranged. In this embodiment, since the wiring resistances and the parasitic capacitances of the common source nodes of the sense amplifiers can be reduced, it is possible to prevent the common source potential from being clamped, while increasing the speed of the sensing operation, when compared with the conventional sense amplifiers as shown in FIG. 5.

Figure 3:
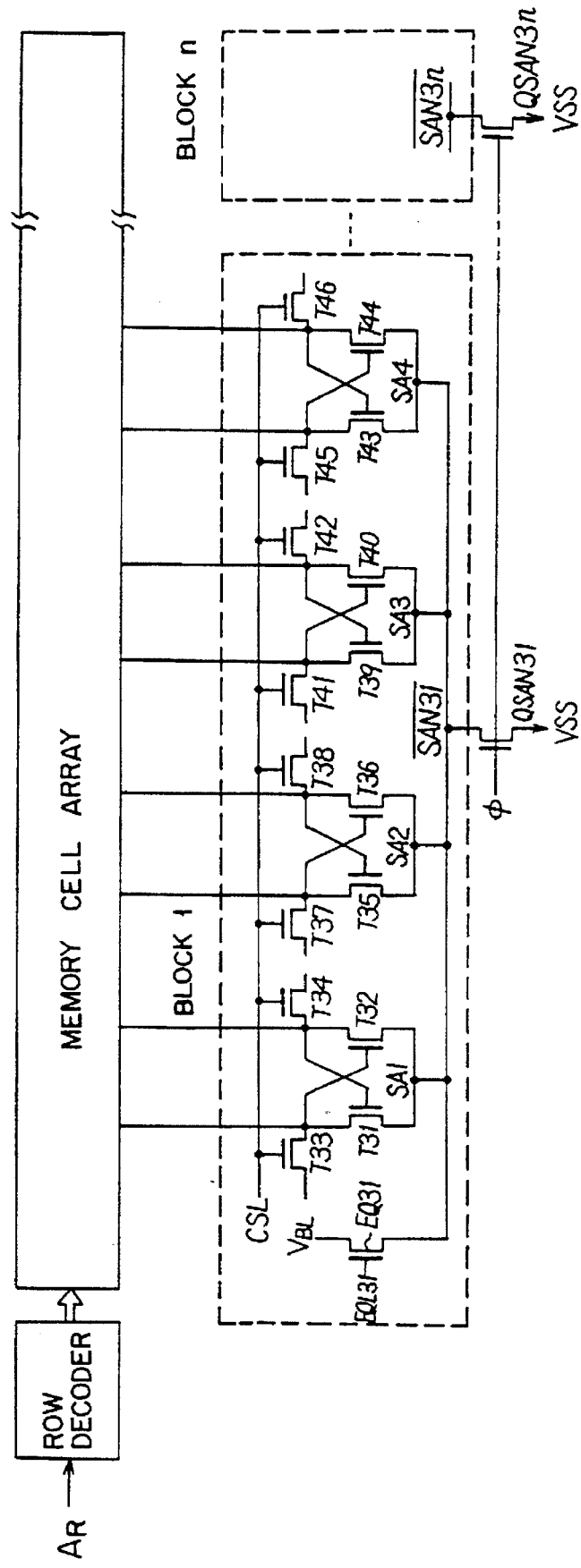
FIG. 3 is a circuit diagram showing a third embodiment of the present invention.

FIG. 3 shows an example in which four sense amplifiers connected to the same column select line CSL constitute a unit block. Alternatively, it is possible to constitute a unit block by a plurality of sense amplifiers connected to different column select lines CSL. Further, in general, since the word lines are divided every several columns to equalize the delay of the word lines, it is possible to constitute a unit block on the basis of a group of the sense amplifiers of the memory cell array connected to the divided word line.

In the case of a conventional 4-bit DRAM, for instance, 1024-unit sense amplifiers connected to the same word line are connected to the same common source node thereof, so that the parasitic capacitance and the wiring resistance at the common source node are large. In the case of the present invention, however, since only a few (one to four, at the minimum) sense amplifiers are connected to the common source node thereof, it is possible to reduce the parasitic capacitance and the wiring resistance at the common source node.

Further, since the parasitic capacitance and the wiring resistance at the common source node are reduced and in addition since the transistors to be driven are divided, it is possible to improve the driving performance of the sense amplifier activating transistors QSAN, respectively. Accordingly, it is possible to eliminate the problem that the common source note potential is clamped as is conventional. Further, since the number of the sense amplifiers connected to the common source node thereof can be reduced, the problem with the column bar status can be also solved, so that the operation speed of the sense amplifiers can be improved.

Figure 4A:
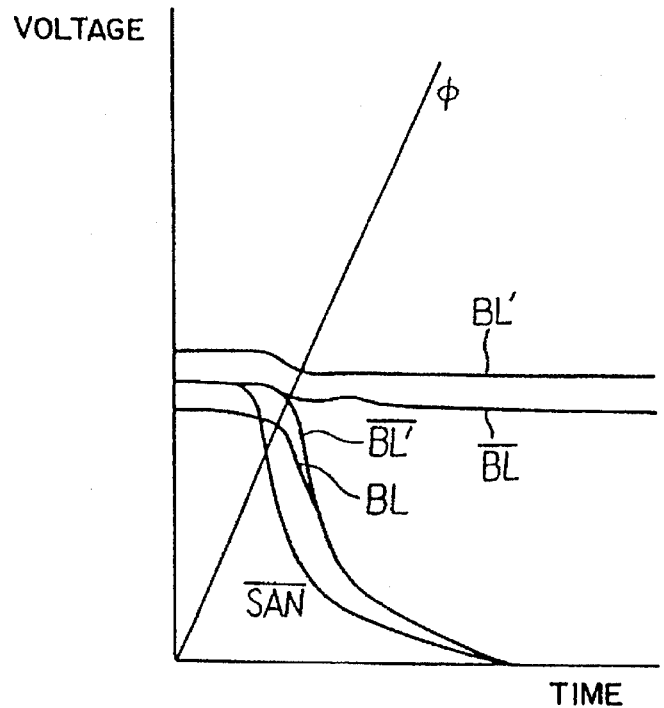
FIGS. 4(a) and 4(b) are signal waveform diagrams for comparison in operation between the embodiments and the conventional memory device.
Figure 4B:
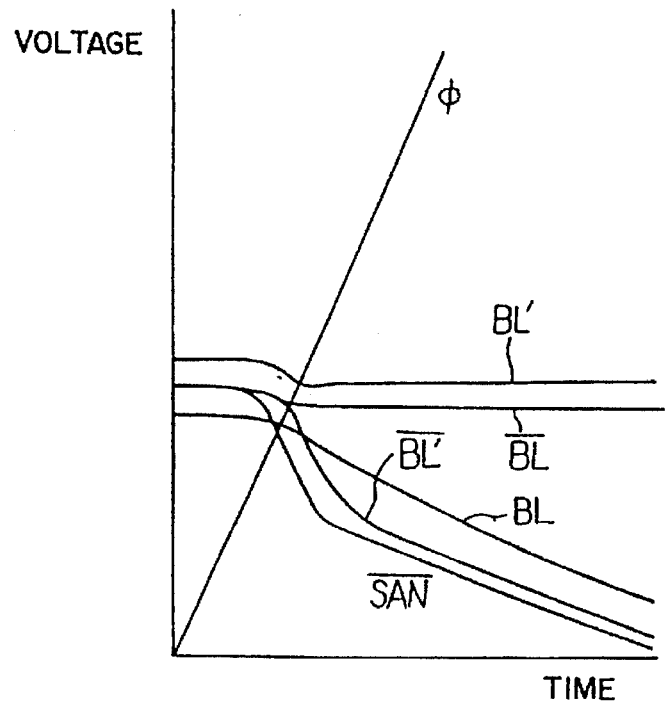

FIGS. 4(a) and (b) shows the comparison of the sense amplifier operation between the senspresplifier of the present invention (FIG. 4(a)) and the conventional sense amplifier (FIG. 4(b)). These graphical representations indicate that the potentials at the node /SAN and the bit lines BL and /BL all drop sharply in the case of the sense amplifier of the present invention, with the result that the operation of the sense amplifiers can be increased and thereby the access time of the memory device can be shortened.

A fourth embodiment of the present invention will be described hereinbelow, in which the amplification performance of the sense amplifiers is selectively increased for higher operation speed, without reducing the read margin of the memory cells due to the fluctuations of the precharge potential of the bit lines.

Figure 8:
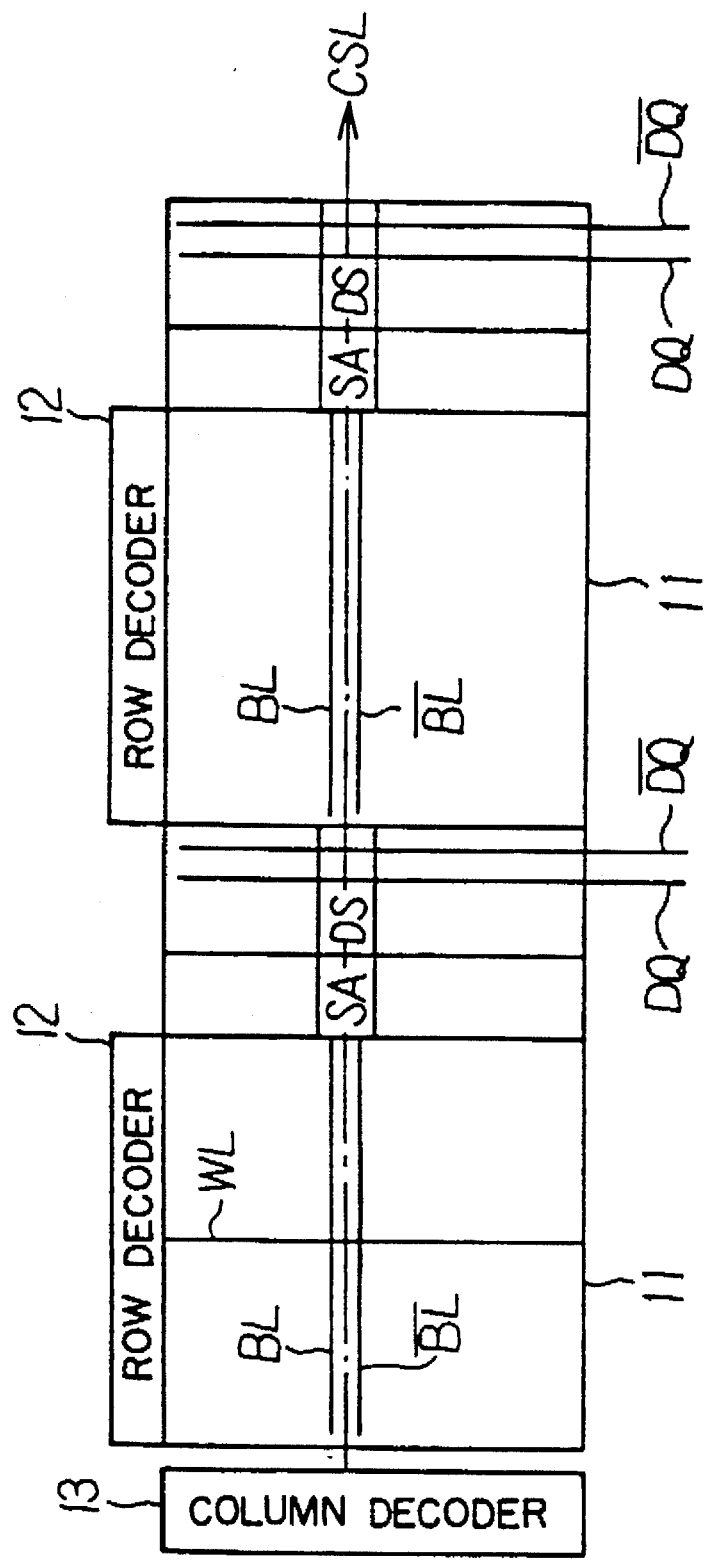
FIG. 8 is a schematic block diagram showing a core configuration of a DRAM.

FIG. 8 shows a block diagram of a DRAM. In the drawing, a memory cell array 11 is provided with a plurality of dynamic memory cells. A plurality of memory cells arranged in the same row (in the vertical direction in the drawing) are connected in common to a specific word line WL of a plurality of word lines, and a plurality of the memory cells arranged in the same column (in the horizontal direction in the drawing) are connected to either one of a pair of specific bit lines BL and /BL of a plurality of bit line paris. The plural word lines are driven by a row decoder 12 selected on the basis of a row address. Further, a bit line sense amplifier SA and a decode switch circuit DS controlled in response to a column select signal CSL are provided for each bit line pair. The data detected by the sense amplifier SA are selected by the decode switch circuit DS, and then read out to a pair of internal data buses DQ and /DQ. Further, the column select signal line CSL is selected on the basis of a column address and driven by the column decoder 13.

Figure 9:
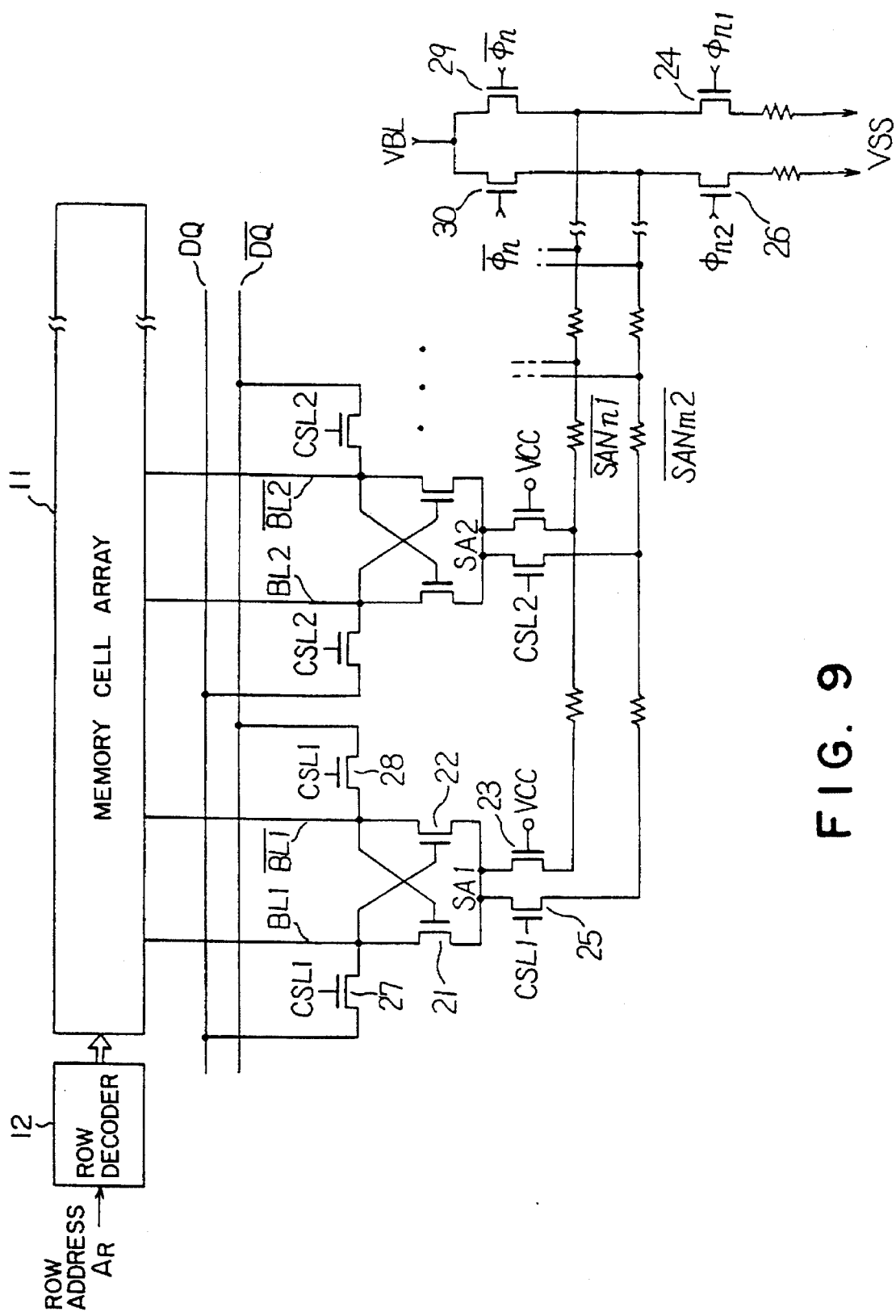
FIG. 9 is a circuit diagram showing a fourth embodiment of the present invention.

FIG. 9 shows sense amplifiers SA and decoder switch circuits DS both shown in FIG. 8 and practical sense amplifier driving circuits not shown in FIG. 8. In this embodiment, a pair of DQ lines are provided as the internal data bus, and each of the bit line sense amplifiers SA1, SA2, ... is provided for each column, respectively. Each of the bit line sense amplifiers SA1, SA2, .. is composed of two N-channel MOSFETs 21 and 22. The drain and gate of these two MOSFETs 21 and 22 are connected to each other in cross coupling fashion. Further, the common junction points of the respective drain and gate of the two MOSFETs 21 and 22 of the sense amplifier SA1, SA2, .. is connected either one of the corresponding bit lines BL1 and/BL1, BL2 and/BL2, ... , respectively. The respective sources of the two MOSFETs 21 and 22 of the sense amplifier SA1, SA2, ... are connected in common for each column. The common source junction points of the sense amplifiers SA1, SA2, ... are connected to a first common wiring /SANnl via an N-channel MOSFET 23 (the gate of which a voltage VCC is applied to operate the MOSFET 23 as a resistance element), respectively. The first common wiring /SANnl is connected to the drain of a first sense amplifier activating MOSFET 24 controlled in response to a first sense amplifier activating signal Φnl. Further, the source of the first sense amplifier activating MOSFET 24 is connected to a reference potential (VSS) terminal.

The common source junction points of the sense amplifiers SA1, SA2, .. for each column are connected to a second common wiring /SANn2 via an N-channel MOSFET 25 (the gate of which a column select signal CSL1, CSL2, . . . is applied, independently), respectively. The second common wiring /SANn2 is connected to the drain of a second sense amplifier activating MOSFET 26 controlled in response to a second sense amplifier activating signal Φn2. Further, the source of the second sense amplifier activating MOSFET 26 is connected to a reference potential (VSS) terminal.

The bit lines of each column are connected to data lines DQ and /DQ via two column switching N-channel MOSFETs 27 and 28, respectively. Further, the column select signals CSL1, CSL2, . . . corresponding to the columns, respectively are supplied to the gates of the respective MOSFETs 27 and 28, independently.

The first common wiring /SANnl and the second common wiring /SANn2 are connected to a bit line precharge potential VBL via two N-channel MOSFETs 29 and 30, respectively. Further, a signal Φ/n activated in the precharge cycle is applied to the gates of these MOSFETs 29 and 30.

Further, in the case of the (½) VCC precharge DRAM such that the bit lines are previously precharged to (½) of the VCC potential before data read, although two restoring P-channel MOSFETs are provided for each sense amplifier, these can be omitted herein because not directly related to the gist of the present invention.

Figure 11:
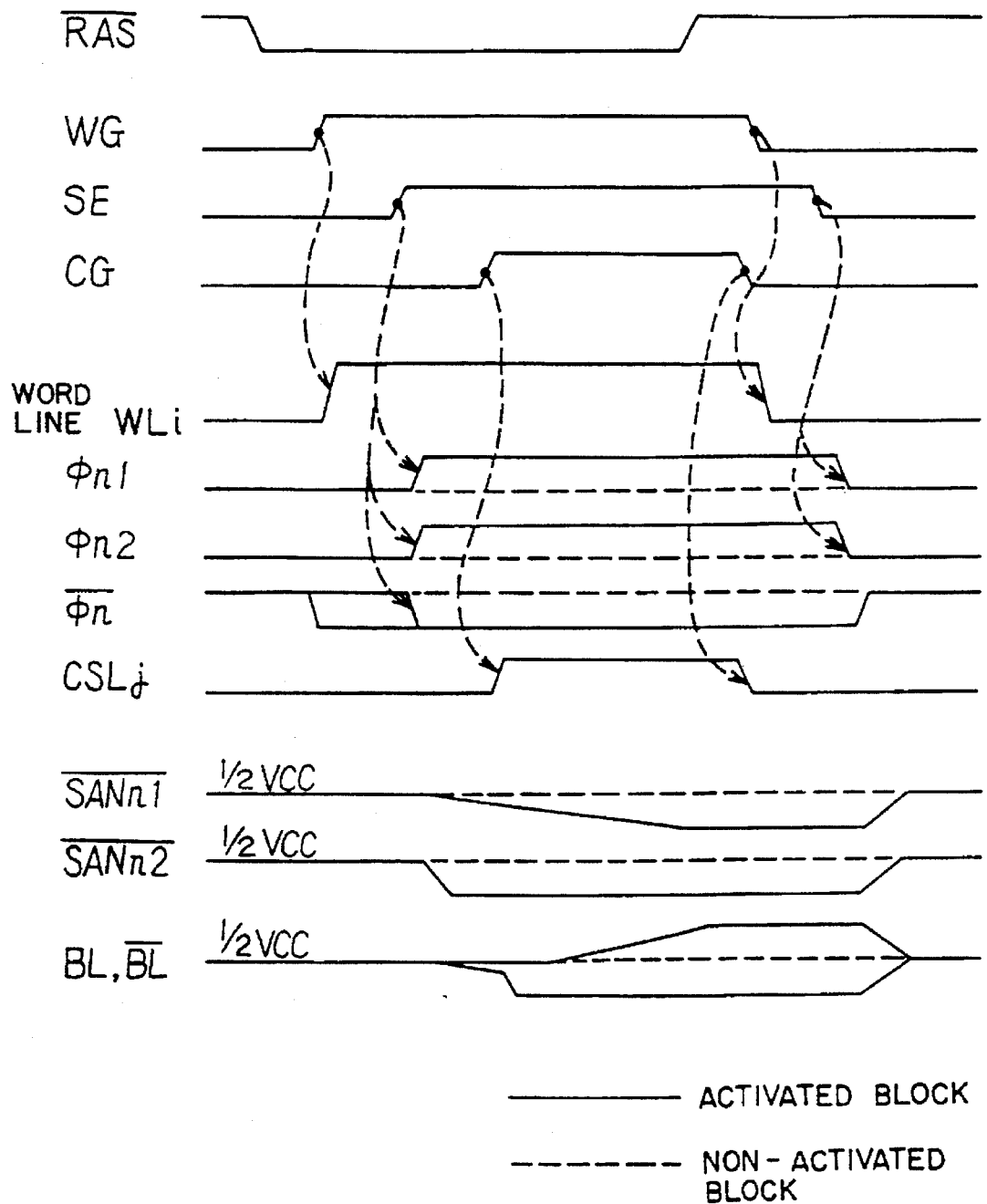
FIG. 11 is a signal timing chart showing the signal waveforms at the respective portions of the fourth embodiment.
Figure 12:
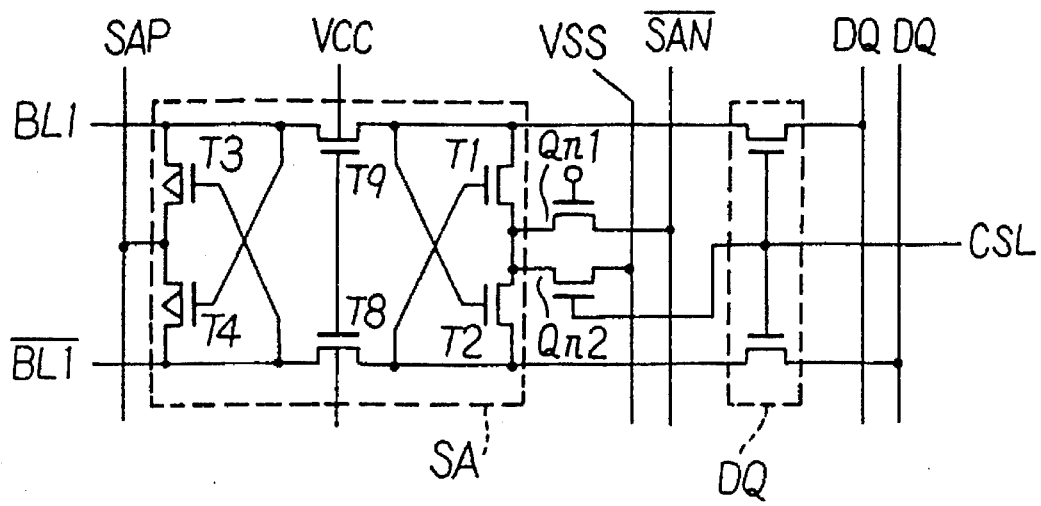
FIG. 12 is a circuit diagram showing an example of the conventional sense amplifier.
Figure 13:
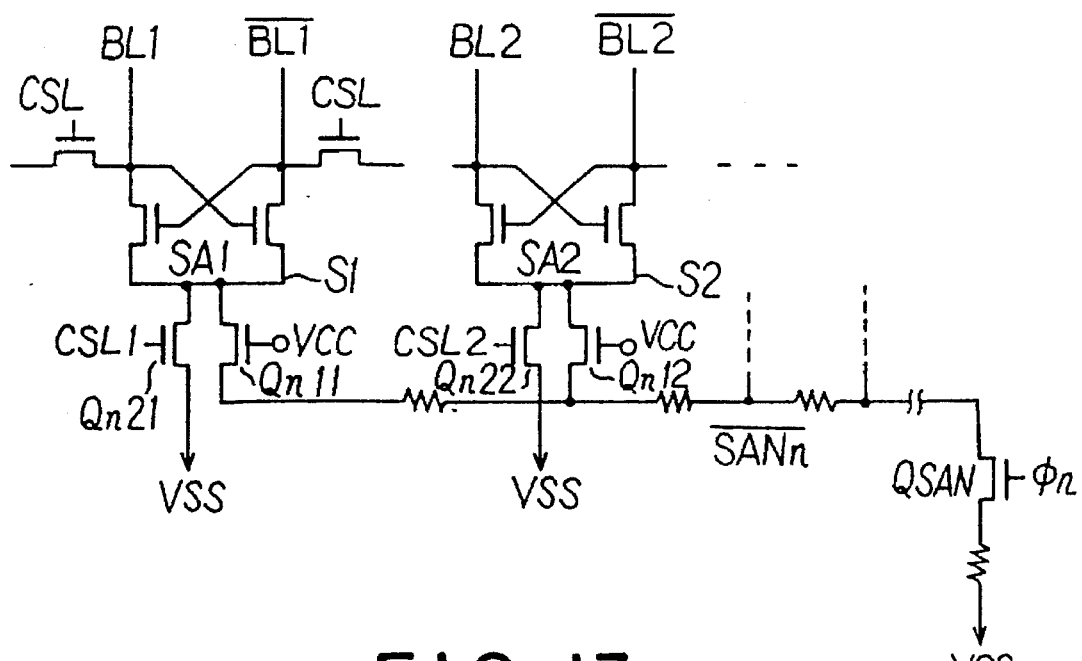
FIG. 13 is a circuit diagram showing an example of the conventional sense amplifier whose performance can be increased selectively.
Figure 14:
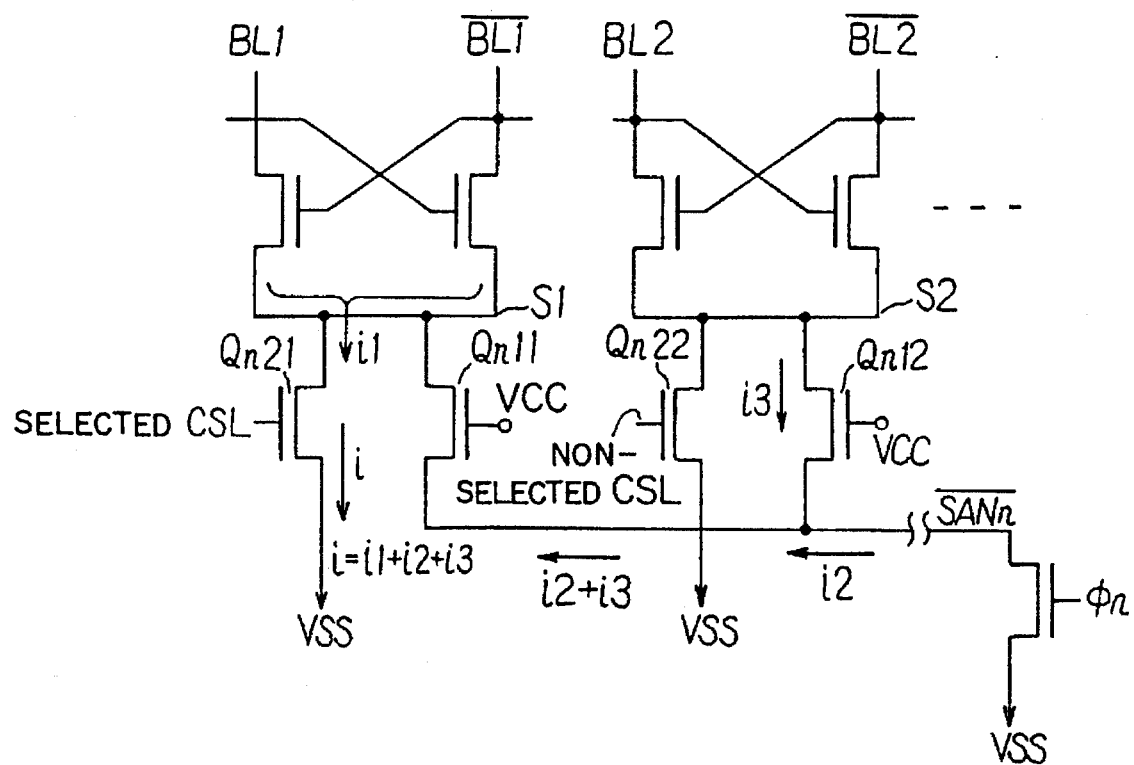
FIG. 14 is a circuit diagram for assistance in explaining the operation of the conventional sense amplifier.
Figure 15:
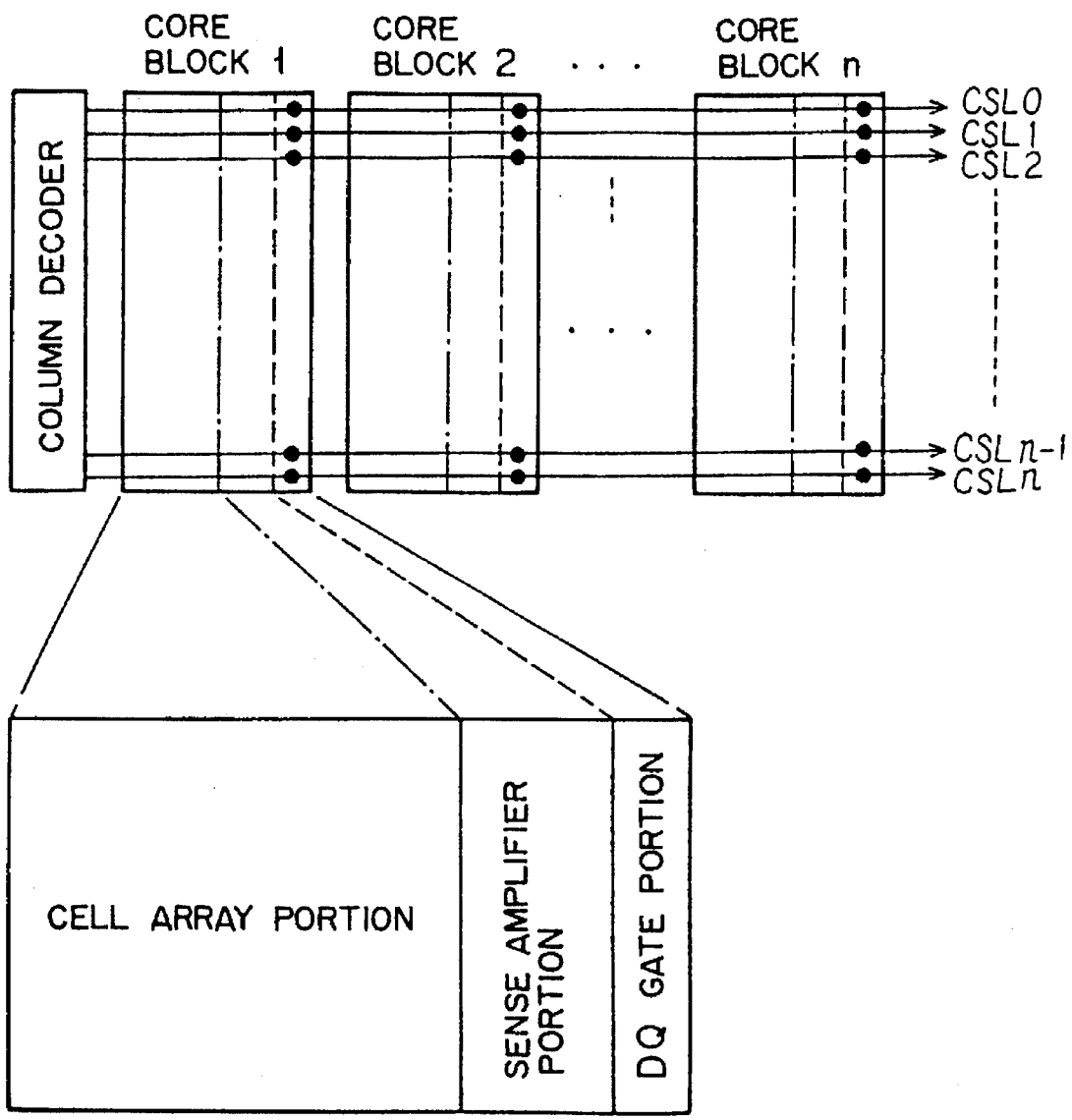
FIG. 15 is a block diagram showing an example of the circuit configurations by which the column select signal lines CSL are arranged in parallel to the bit lines so as to be used in common for a plurality of unit core blocks.

The operation of sensing the bit line potentials and of reading data to the internal data bus by the sense amplifier of the memory device of the afore-mentioned embodiment will be described hereinbelow with reference to FIGS. 10 and 11. FIG. 10 shows a circuit for generating a control signal, and FIG. 11 shows a timing chart of the signal waveforms thereof.

First, when the /RAS (row address strobe) signal supplied to an input buffer 100 as a row select signal changes to an "L" level, the memory chip is activated. This/RAS signal is given to a delay circuit 101 via the input buffer 100 to generate a WG signal. This WG signal is changed to a sense amplifier activating signal SE via another delay circuit 102, and further changed to a CG signal via still another delay circuit 103. In response to the /RAS signal, a row address is given from an address bus to a row address buffer 104. The row address signal X outputted by the row address buffer 104 is given to a row decoder 105. In response to the WG signal, the row decoder 105 generates a word line drive signal WL. Further, a column address is given from the address bus to a column address buffer 108. The column address buffer 108 gives the column address signal Y to a column decoder 109. In response to the CG signal, the column decoder 109 generates a column select signal CSL.

One word line WLi is selected by the row decoder 105 selected by the row address, and the selected word line WLi is driven to an "H" level. Accordingly, read potentials of a plurality of memory cells connected to the selected word lines WLi are transmitted to one of the corresponding bit line pair, respectively, so that a potential difference is generated between a pair of the bit lines BL and /BL. Thereafter, the sense amplifier signal SE changes to the "H" level. In synchronism with this signal SE, a first sense amplifier activating signal Φn1 and a second sense amplifier activating signal Φn2 selected by a sense amplifier driver 106 (to which a part of row address signals is given) change to the "H" level to turn on the MOSFETs 24 and 26 respectively, so that the bit line sensing operation starts. The current of the MOSFET 21 or 22 for pulling down the bit line potential to a lower level is discharged to the reference potential (VSS) terminal via the MOSFET 23, the first common wiring /SANn1, and the sense amplifier activating MOSFET 24. In this case, since there exists a large parasitic resistance such as the wiring resistance of the first common wiring /SANn1, the turn-on resistance of the sense amplifier activating MOSFET 24, etc. and a capacitance of the bit lines to be discharged between the sense amplifier and the reference potential (VSS) terminal, the sense amplifier is not pulled down to the potential VSS at high speed. However, since the second sense amplifier activating signal Φn2 is at the "H" level, the MOSFET 26 is also turned on. In this case, since there exists only a small capacitance such as junction capacitances, etc. in the second common wiring /SANn2, it is possible to pull down the sense amplifier potential to the reference potential VSS at high speed. In addition, when a specific column select signal CSLj (e.g., SCL1) changes to the "H" level, since the MOSFET 25 connected to the sense amplifier of the selected column is turned on, the sense amplifier provided for the selected column is bypassed to the reference potential VSS via the second common wiring /SANn2 and the sense amplifier activating MOSFET 26. As a result, it is possible to prevent the source node potential of the sense amplifier from being clamped, thus realizing a high speed operation of the sense amplifier.

The signal /Φn outputted by a sense amplifier equalizer 107 shown in FIG. 10 is given to the gates of the MOSFETs 29 and 30 for controlling the precharge of the first and second common wirings /SANn1 and /SANn2. This signal Φ/n can be changed to the "L" level in synchronism with the decision of the row address X0, X1, . . or in synchronism with the signal SE. The signal/Φn is kept at the "L" level when the sense amplifier is in operation, and the MOSFETs 29 and 30 are kept turned off during this period, so that the first and second common wirings /SANn1 and /SANn2 are not precharged by the supply voltage VBL of (½) VCC.

As described above, in the core block selected by the row address, the CR time constant of only the sense amplifier provided for the column selected by the activated column select signal is extremely reduced for the selected sense amplifier operation, so that it is possible to improve the speed of the operation of sensing the bit line potential.

On the other hand, in the core block not selected by the row address, even if the column select signal CSL is activated, since the first and second sense amplifier activating signals Φn1 and Φn2 are both set to the "L" level, so that the MOSFETs 24 and 26 are both kept turned off. Further, since the precharge controlling signal/Φn is kept at the "H" level, the MOSFETs 29 and 30 are both kept turned on, so that the first and second common wirings /SANn1 and /SANn2 are kept at the bit line precharge potential and no current flows through the sense amplifiers. That is, the operating current will not increase and the bit line precharge potential will not fluctuate.

In this embodiment, when data is read, the first and second sense amplifier activating transistors of only the unit core block selected by a row address are turned on, and further only the switching element connected to the column select line selected by a column address is turned on. Therefore, only the sense amplifiers corresponding to the row address and the column address are connected to the reference potential through the first and second common wirings for activation. In this case, since only the switching element connected to the column select line is turned on among a plurality of switching elements connected to the second common wiring, it is possible to connect the selected sense amplifier to the reference potential through the second common wiring small in the wiring resistance and the parasitic capacitance. Therefore, since only the sense amplifier of the selected column of the selected unit core block can be selectively activated, it is possible to improve the speed of the operation of sensing the bit line potential.

As described above, in the semiconductor memory device of the first and second embodiments, since the CR time constant at the common source node of the sense amplifier can be reduced, it is possible to realize a high speed sensing operation. In addition, in the semiconductor memory device of the third and fourth embodiments, since no large current flows to the source node of the operating sense amplifier due to the divided operation of the core blocks, it is possible to prevent the margin in reading data from the memory cell from being reduced by the fluctuations in the bit line precharge potential due to the current flowing to the source node of the sense amplifier.

What is claimed is:

1. A semiconductor memory device comprising:
    a memory cell array having a plurality of memory cells and a plurality of bit line pairs, the bit line pairs being precharged to a first potential of ½ Vcc before a sensing operation;
    a plurality of sense amplifier circuits, each of said sense amplifier circuits being connected to one pair of the bit line pairs and having a sense node;
    a plurality of equalizing transistors, each of said equalizing transistors being connected between a first terminal supplied with the first potential of ½ Vcc and said sense node, each of said sense amplifier circuits being precharged to the first potential of ½ Vcc via a corresponding one of said equalizing transistors; and
    a plurality of activating transistors, each of said activating transistors being connected between a second terminal supplied with a second potential of Vss and said sense node of one of said sense amplifier circuits, each of said sense amplifier circuits being discharged to the second potential of Vss via a corresponding one of said activating transistors, the numbers of said sense amplifier circuits, said equalizing transistors and said activating transistors being equal to each other.

2. The semiconductor memory device of claim 1, wherein each of said sense amplifier circuits has first and second transistors, one end of said first transistor being connected to one of said one bit said line pair and the other end thereof being connected to said sense node, one end of said second transistor being connected to the other of said one bit line pairs and the other end thereof being connected to said sense node, and said one end of said second transistor said being connected to a gate of said first transistor, and said one end of said first transistor being connected to a gate of said second transistor.

3. The semiconductor memory device of claim 2, wherein said first and second transistors are N-channel MOSFETs.

4. The semiconductor memory device of claim 2, further comprising a plurality of column select lines to decode on the basis of a decode signal applied by a column decoder, one of said column select lines selecting one of said sense amplifier circuits, first and second complementary data supplied by one selected sense amplifier circuit being transmitted to first and second complementary data lines.

5. The semiconductor memory device of claim 4, wherein each of said plurality of sense amplifier circuits has first and second output nodes, a first DQ transistor being connected between the first output node and said first complementary data line, a second DQ transistor being connected between the second output node and said second complimentary data line, said first and second DQ transistors being turned on through a corresponding one of said column select lines.

6. The semiconductor memory device of claim 1, wherein said activating transistors one turned on in response to a signal corresponding to a row address signal.

7. The semiconductor memory device of claim 1, wherein each of said equalizing transistors is turned on in response to a corresponding one of a plurality of precharge signals.

8. A semiconductor memory device comprising:
- a memory cell array having a plurality of memory cells and a plurality of bit line pairs, the bit line pairs being precharged to a first potential of ½ Vcc before a sensing operation;
- a plurality of sense amplifier circuits, each of said sense amplifier circuits being connected to one pair of the bit line pairs and having a sense node;
- said sense amplifier circuits being divided into a plurality of blocks each having a plurality of sense amplifier circuits, said sense nodes of said sense amplifier circuits of each block being connected in common as a common sense node;
- a plurality of equalizing transistors, each of said equalizing transistors being connected between a first terminal supplied with the first potential of ½ Vcc and said common sense node, said plurality of sense amplifier circuits belonging to each block being precharged to the first potential of ½ Vcc via an equalizing transistor corresponding to each block; and
- a plurality of activating transistors, each of said activating transistors being connected between second terminal supplied with a second potential of Vss and said common sense node, said plurality of sense amplifier circuits belonging to each block being discharged to the second potential of Vss via a corresponding one of said activating transistors, the numbers of said blocks, said equalizing transistors and said activating transistors being all equal to each other.

9. The semiconductor memory device of claim 8, wherein each of said sense amplifier circuits has first and second transistors, one end of said first transistor being connected to one of said one bit line pair and the other end thereof being connected to said sense node, one end of second transistor being connected to the other of said one bit line pair and the other end thereof being connected to said sense node, and said one end of said second transistor being connected to a gate of said first transistor, and said one end of said first transistor being connected to a gate of said second transistor.

10. The semiconductor memory device of claim 9, wherein said first and second transistors are N-channel MOSFETs.

11. The semiconductor memory device of claim 8, further comprising a plurality of column select lines to decode on the basis of a decode signal applied by a column decoder, one of said column select lines selecting one of said sense amplifier circuits, first and second complementary data supplied by one selected sense amplifier circuit being transmitted to first and second complementary data lines.

12. The semiconductor memory device of claim 11, wherein each of said plurality of sense amplifier circuits has two first and second output nodes, a first DQ transistor being connected between the first output node and said first complementary data line, a second DQ transistor being connected between the second output node and said second complimentary data line, said first and second DQ transistors being turned on through a corresponding one of said column select lines.

13. The semiconductor memory device of claim 8, wherein said activating transistors turn on in response to a signal corresponding to a row address signal.

14. The semiconductor memory device of claim 8, wherein each of said equalizing transistors is turned on in response to a corresponding one of a plurality of precharge signals.

15. A semiconductor memory device comprising:
- a memory cell array having a plurality of memory cells and a plurality of bit line pairs, the bit line pairs being precharged to a first potential before a sensing operation; and
- a plurality of sense amplifier blocks, each of said sense amplifier blocks including:
  - a plurality of sense amplifier circuits, each of said sense amplifier circuits being connected to one pair of the bit line pairs and having a sense node, sense nodes of said sense amplifier circuits being connected in common as a common sense node;
  - an equalizing transistor connected between a first terminal supplied with the first potential and the common sense node; and
  - an activating transistor connected between a second terminal supplied with a second potential and the common sense node, the number of said sense amplifier blocks, said equalizing transistors and said activating transistors being equal to each other.

16. The semiconductor memory device of claim 15, wherein each of said sense amplifier circuits has first and second transistors, one end of said first transistor being connected to one of said one bit line pair and the other end thereof being connected to said sense node, one end of said second transistor being connected to the other of said one bit line pair and the other end thereof being connected to said sense node, and said one end of said second transistor being connected to a gate of said first transistor, and said one end of said first transistor being connected to a gate of said second transistor.

17. The semiconductor memory device of claim 16, wherein said first and second transistors are N-channel MOSFETs.

18. The semiconductor memory device of claim 15, further comprising a plurality of column select lines to decode on the basis of a decode signal applied by a column decoder, one of said column select lines selecting one of said sense amplifier circuits, first and second complementary data supplied by one selected sense amplifier circuit being transmitted to first and second complementary data lines.

19. The semiconductor memory device of claim 18, wherein each of said plurality of sense amplifier circuits has two first and second output nodes, a first DQ transistor being connected between the first output node and said first complementary data line, a second DQ transistor being connected between the second output node and said second complimentary data line, said first and second DQ transistors being turned on through a corresponding one of said column select lines.

20. The semiconductor memory device of claim 15, wherein said activating transistors one turned on in response to a signal corresponding to a row address signal.

21. The semiconductor memory device of claim 15, wherein each of said equalizing transistors is turned on in response to a corresponding one of a plurality of precharge signals.

22. The semiconductor memory device of claim 15, wherein the first potential is an intermediate potential between a positive side supply potential and the second potential.

* * * * *